(12) United States Patent
Kim et al.

(10) Patent No.: US 7,151,043 B2
(45) Date of Patent: Dec. 19, 2006

(54) METHOD OF MANUFACTURING A SEMICONDUCTOR DEVICE

(75) Inventors: Tae-hyun Kim, Gyeonggi-do (KR); Byoung-moon Yoon, Gyeonggi-do (KR); Won-jun Lee, Seoul (KR); Yong-sun Ko, Gyeonggi-do (KR); Kyung-hyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/082,616

(22) Filed: Mar. 17, 2005

(65) Prior Publication Data

US 2005/0266647 A1    Dec. 1, 2005

(30) Foreign Application Priority Data

May 25, 2004    (KR)    ................ 10-2004-0037198

(51) Int. Cl.
*H01L 21/76*    (2006.01)

(52) U.S. Cl. .............. 438/435; 438/424; 438/437; 438/266

(58) Field of Classification Search ......... 438/435
See application file for complete search history.

(56) References Cited

U.S. PATENT DOCUMENTS 6,146,970 A  *  11/2000   Witek et al. ............... 438/424

FOREIGN PATENT DOCUMENTS

| JP | 2001284556 | 10/2001 |
| JP | 2002033476 | 1/2002 |
| JP | 2002246481 | 8/2002 |

* cited by examiner

*Primary Examiner*—Jack Chen
(74) *Attorney, Agent, or Firm*—Myers Bigel Sibley & Sajovec, PA (57) ABSTRACT

Methods of manufacturing a semiconductor device are provided. A trench is formed in a semiconductor substrate. A first field oxide layer is formed that partially fills the trench. The first field oxide layer defines an active region of the substrate that is adjacent to the trench. An upper portion of sidewalls of the trench extends upward beyond a surface of the first field oxide layer. A first liner is formed on the first field oxide layer and on the portion of the sidewalls of the trench that extend upward beyond the first field oxide layer. A second field oxide layer is formed on the first liner and fills the trench. The second field oxide layer and the first liner are each partially removed to expose a top adjacent surface and upper sidewalls of the trench along the active region of the substrate. A dielectric layer is formed on the exposed top adjacent surface and upper sidewalls of the trench. A gate electrode is formed on the dielectric layer.

20 Claims, 8 Drawing Sheets

METHOD OF MANUFACTURING A SEMICONDUCTOR DEVICE

CROSS REFERENCE TO RELATED APPLICATION

This application claims priority under 35 USC § 119 to Korean Patent Application No. 2004-37198 filed on May 25, 2004, the contents of which is incorporated herein by reference in its entirety.

FIELD OF THE INVENTION

The present invention relates to methods of manufacturing semiconductor devices, and more particularly to methods of manufacturing semiconductor devices that may be used in non-volatile memories.

BACKGROUND OF THE INVENTION

Two types of semiconductor memory devices are a random access memory (RAM) and a read only memory (ROM). The RAM devices provide a volatile memory that can include a dynamic random access memory (DRAM) and/or a static random access memory (SRAM), both of which lose data upon a loss of power, but can provide relatively fast write/read operations. In contrast, the ROM devices provide a non-volatile memory that can retain data upon a loss of power, but can provide relatively slower write/read operations. Non-volatile memory devices can have an almost permanent data retention capacity. One type of the non-volatile memory device is a flash memory, such as an electrically erasable and programmable ROM (EEPROM). The EEPROMs are widely used in memory devices because they allow both reading and writing of data.

The flash memory devices can be categorized as a NAND type and a NOR type devices based on their circuitry. In the NAND type flash memory device, a number of cell transistors are connected in series to form a unit string, and these unit strings are connected in parallel between a bit line and a ground line. In the NOR type flash memory device, the respective cell transistors are coupled in parallel between the bit line and the ground line. In a comparison of the NOR and the NAND type devices, the NOR type devices can provide relatively higher-speed operation and the NAND type devices can allow higher integration density.

The flash memory cell can have a vertical gate structure, which includes a floating gate formed on a silicon substrate. The multi-layered gate structure typically includes at least one tunnel oxide layer or dielectric layer, and a control gate formed on or near the floating gate.

In the multi-layered gate structure of the NAND type flash memory cell, the floating gates are usually located in the active region with a linear structure. The floating gates should be formed on the active region with at least a defined size that is sufficient to maintain an adequate cell current and coupling ration. However, as the size of memory cells becomes increasingly smaller, the area of the active region also becomes smaller and the area on which the floating gate can be formed also decreases. As a result, Fower-Nordheim (F-N) tunneling may not properly occur during operation on a memory cell because of, for example, decreased cell current and deterioration in the distribution characteristics of the tunneling.

In Japanese Patent Laid-open Publication No. 2002-33476, a field region is wet-etched to expand the active region after finishing an element isolation process that defines an active region. Although the area of the active region may be increased, the increase appears to be very small relative to the reduction in the thickness of the field region, as the result of the wet etching process.

SUMMARY OF THE INVENTION

Some embodiments of the present invention provide methods of manufacturing semiconductor devices. A trench is formed in a semiconductor substrate. A first field oxide layer is formed that partially fills the trench. The first field oxide layer defines an active region of the substrate that is adjacent to the trench. An upper portion of sidewalls of the trench extends upward beyond the first field oxide layer. A first liner is formed on the first field oxide layer and on the portion of the sidewalls of the trench that extends upward beyond the first field oxide layer. A second field oxide layer is formed on the first liner and fills the trench. The second field oxide layer and the first liner are each partially removed to expose a top adjacent surface and upper sidewalls of the trench along the active region of the substrate. A dielectric layer is formed on the exposed top adjacent surface and upper sidewalls of the trench. A gate electrode is formed on the dielectric layer.

In some further embodiments, a hard mask pattern is formed on the substrate and with a portion of the substrate exposed therebetween. The portion of the substrate that is exposed between the hard mask pattern is etched to form the trench. The first field oxide layer is formed to fill up the trench. The first field oxide layer in the trench is partially removed to expose an upper portion of sidewalls of the trench in the substrate. After the trench is formed, an inner oxide layer can be formed by oxidizing the sidewalls and bottom surface of the trench in the semiconductor substrate. A second liner can then be formed on the inner oxide layer in the trench. The first field oxide layer can be formed on the second liner opposite to the inner oxide layer.

In yet some further embodiments, prior to forming the first liner, a portion of the inner oxide layer and the second liner can be removed to expose an upper portion of the sidewall of the trench. After forming the hard mask pattern, the exposed portion of the substrate can be thermally oxidized to form an oxide layer on the exposed portion of the substrate. Prior to forming the inner oxide layer, the oxide layer on the exposed portion of the substrate can be completely removed. The first liner can include silicon oxide, and can include undoped silicate glass (USG).

In yet some further embodiments, the first liner can include a material having an etching rate that is at least as high as that of the second field oxide layer. The second field oxide layer can include high density plasma (HDP) oxide, and the first liner can include USG. The second field oxide layer and the first liner can include USG.

In yet some further embodiments, the second field oxide layer and the first liner can be partially removed by a wet etching process to form a recessed dent in the second field oxide layer so that sidewalls of the second field oxide layer slope downward from an upper surface of the second field oxide layer to the sidewalls of the trench. The dielectric layer can be formed in the recessed dent of the second field oxide layer, and the gate electrode can be formed on the dielectric layer in the recessed dent of the second field oxide layer.

In yet some further embodiments, the partial removing of the second field oxide layer and the first liner can provide an upper surface of the second field oxide layer that is higher than an upper surface of the active region of the semiconductor substrate. The first field oxide layer and the second field oxide layer can include a substantially identical insulation material. The first field oxide layer and the second field oxide layer can each include HDP oxide. Prior to forming the dielectric layer, an upper edge portion of the active region of the semiconductor can be rounded along the trench. The upper edge portion of the active region can be rounded by removing the upper edge portion with a cleaning solution.

In yet some further embodiments, after forming the gate electrode, a second dielectric layer can be formed on the gate electrode, and a second gate electrode can be formed on the second dielectric layer.

In some other embodiments of the present invention, a method of manufacturing a semiconductor device, includes forming a trench in a semiconductor substrate. A first field oxide layer is formed that partially fills the trench, the first field oxide layer defining an active region of the substrate adjacent thereto, where an upper portion of sidewalls of the trench extends upward beyond the first field oxide layer. A second field oxide layer is deposited that fills up the trench. The second field oxide layer includes an insulation material having an etching rate that is higher than an etching rate of the first field oxide layer. The second field oxide layer is partially removed to expose a top adjacent surface and upper sidewall of the trench along the active region of the substrate. A dielectric layer is formed on the exposed top adjacent surface and upper sidewalls of the trench. A gate electrode is formed on the dielectric layer.

In some further embodiments, the first field oxide layer is formed by forming a hard mask pattern on the substrate that exposes a portion of the substrate, etching the portion of the substrate that is exposed by the hard mask pattern to form the trench, forming the first field oxide layer to fill up the trench, and partially removing the first field oxide layer in the trench to expose an upper portion of sidewalls of the trench. After forming the trench, an inner oxide layer can be formed by oxidizing the sidewalls and bottom surface of the trench in the semiconductor substrate. A second liner can be formed on the inner oxide layer in the trench. The first field oxide layer can be on the second liner opposite to the inner oxide layer.

In yet some further embodiments, prior to forming the second field oxide layer, a portion of the inner oxide layer and the second liner can be removed to expose an upper portion of the sidewall of the trench. After forming the hard mask pattern, the exposed portion of the substrate can be thermally oxidized to form an oxide layer on the exposed portion of the substrate. Prior to forming the inner oxide layer, the oxide layer formed by thermally oxidizing the exposed portion of the substrate can be completely removed. The first field oxide layer can include high density plasma (HDP) oxide, and the second field oxide layer can include USG. After forming the gate electrode, a second dielectric layer can be formed on the gate electrode, and a second gate electrode can be formed on the second dielectric layer.

DETAILED DESCRIPTION OF EMBODIMENTS OF THE INVENTION

While the invention is susceptible to various modifications and alternative forms, specific embodiments thereof are shown by way of example in the drawings and will be described in detail herein. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 11 are cross-sectional views that illustrate structure and methods of manufacturing a non-volatile semiconductor memory device according to some embodiments of the present invention.

Figure 1:
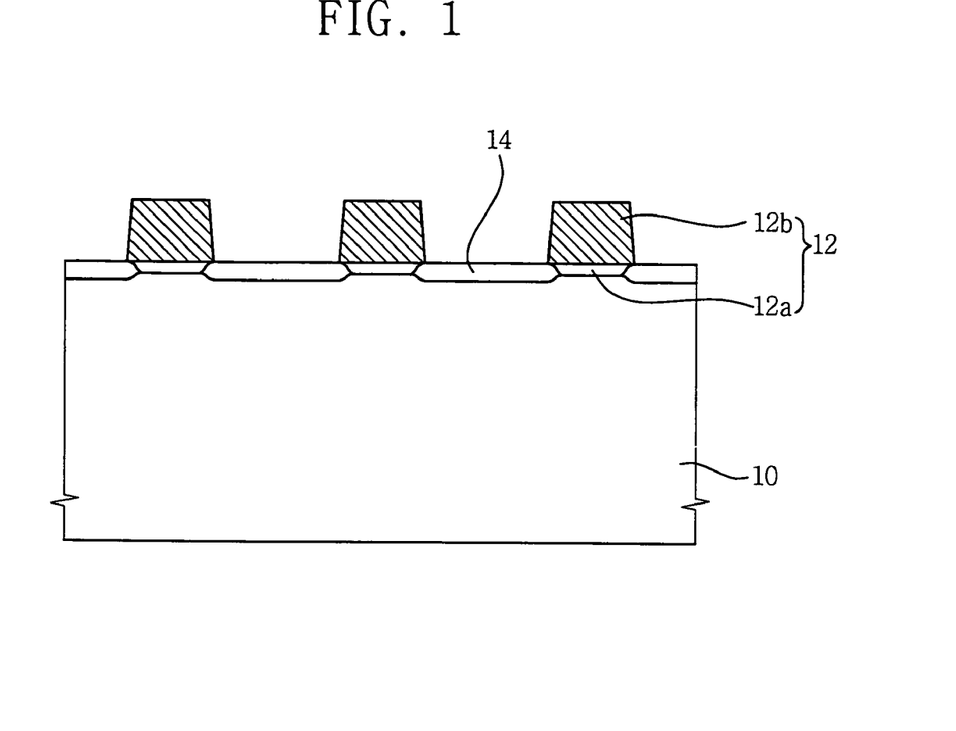
FIGS. 1 to 11 are cross-sectional views that illustrate structure and methods of manufacturing a non-volatile semiconductor memory device according to some embodiments of the present invention.

Referring to FIG. 1, a buffer oxide layer (not shown) is formed on a substrate 10 made of a semiconductor material such as silicon, and then a silicon nitride layer (not shown) to be served as a hard mask layer is formed on the buffer oxide layer. Thereafter, a photoresist is coated on the silicon nitride layer and patterned using a photolithographic process to thereby form a photoresist pattern (not shown) on the silicon nitride layer.

Using the photoresist pattern as an etching mask, the silicon nitride layer and the buffer oxide layer are etched to form a hard mask pattern 12, which includes a buffer oxide layer pattern 12a and a silicon nitride layer pattern 12b stacked thereon. The hard mask pattern 12 selectively exposes field regions of the substrate 10. The etching process of the silicon nitride layer is performed such that the silicon nitride layer pattern 12b has a desired slant sidewall. Consequently, the hard mask pattern 12 can have an upper portion that has a smaller cross sectional area than that of a lower portion thereof. More particularly, a top surface of the hard mask pattern 12 can have a larger area than that of a bottom surface thereof that is directly on the buffer oxide layer pattern 12a. An area masked by the hard mask pattern 12 is thereby larger than that masked by the photoresist pattern. Consequently, when an etching process is performed using the hard mask pattern 12 as an etching mask, an opening (i.e., a trench) may be formed that has a smaller size than the area that was exposed by the photoresist pattern (i.e., the exposed area of the field regions of the substrate 10).

Thereafter, the photoresist pattern is removed from the hard mask pattern 12 by an etching and/or a stripping process.

A portion of the substrate 10 that is exposed by the hard mask pattern 12 is thermally oxidized to form a silicon oxide layer 14 on the substrate 10. When the silicon oxide layer 14 is formed on the substrate 10, the substrate 10 that makes contact with a lower edge of the hard mask pattern 12 is partially consumed through a Bird's Beak effect. Therefore, portions of the substrate 10 become rounded off along and around and adjacent lower edge of the hard mask pattern 12 as shown in FIG. 1.

Figure 2:
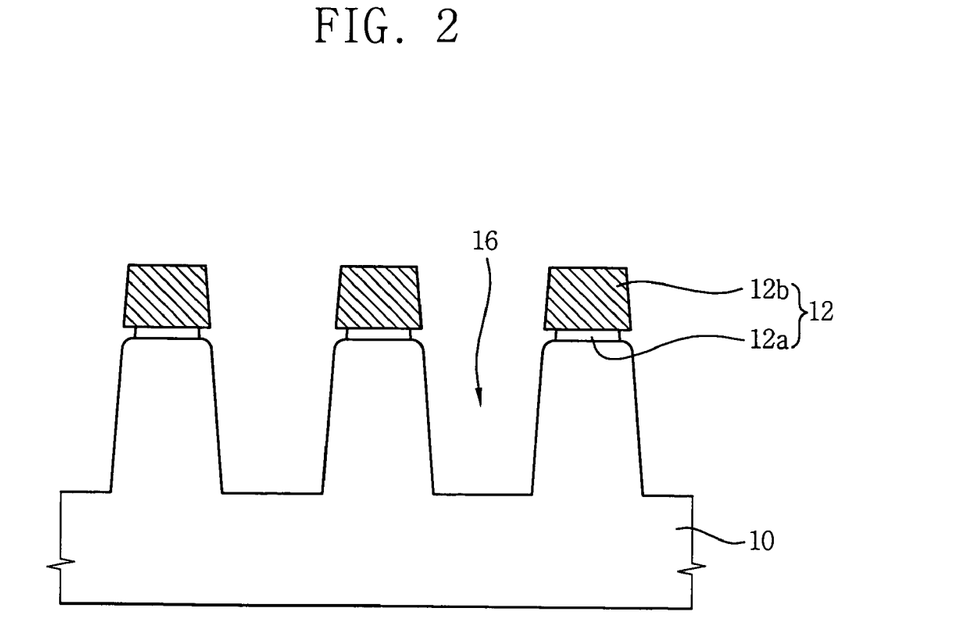

As shown in FIG. 2, a trench 16 is formed by partially etching the silicon oxide layer 14 and the substrate 10 using the hard mask pattern 12 as an etching mask. The trench 16 region of the substrate 10 corresponds to a field region, and the region of the substrate 10 between adjacent trenches 16 corresponds to an active region. Hereinafter, a boundary between the field and active regions is referred to as a "sidewall of the trench 16" or a "lateral face of the active region."

The silicon oxide layer 14 exposed between the lower edge of the hard mask pattern 12 and the substrate 10 is removed through a wet etching process. Specifically, the silicon oxide layer 14 may be removed by a wet etching process using a HF solution diluted with water or an LAL solution as an etchant. The LAL solution is a mixture of $NH_4F$, HF and $H_2O$.

Figure 3:
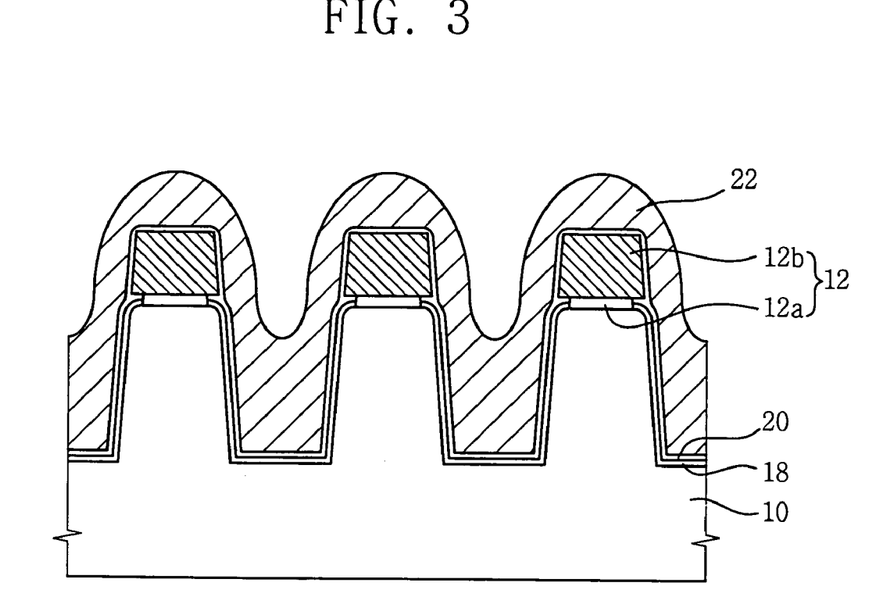

Referring to FIG. 3, an inner wall of the trench 16 is thermally oxidized to thereby form an inner oxide layer 18 thereon. The inner oxide layer 18 of the trench 16 may be formed to at least partially cure damage to the substrate 10 caused by the etching process to form the trench 16. The inner oxide layer 18 may have a thickness of from about 30 to 200 Å.

A first insulation liner 20 is formed on the inner oxide layer 18 by a chemical vapor deposition (CVD) process. When an insulation layer filling up the trench 16 is formed through subsequent processes, the first insulation liner 20 can serve to reduce damage to the inner wall of the trench 16 during subsequent manufacturing processes. The first insulation liner 20 may be formed using a material that can be removed by a single etching process under defined etching conditions. For example, the first insulation liner 20 may be formed from silicon oxide and/or middle temperature oxide (MTO) or similar material.

A first preliminary field oxide layer 22 is formed in the trench 16 and on the hard mask pattern 12 such that the first preliminary field oxide layer 22 can completely or partially fill up the trench 16. The first preliminary field oxide layer 22 may include high density plasma oxide (hereinafter, referred to as an "HDP oxide") formed by a high density plasma CVD process. Using a high density plasma CVD process, a vapor deposition process and a sputtering process are repeated to form the first preliminary field oxide layer 22. The HDP oxide formed thereby can have a high relative density and good insulation characteristics, which can be particularly well suited for use as a field oxide layer.

Figure 4:
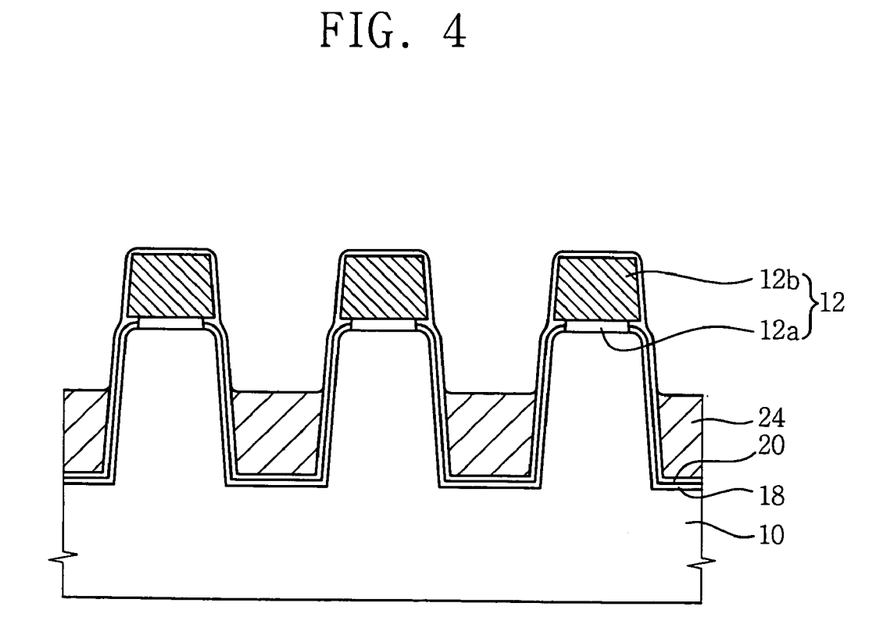

As shown in FIG. 4, a first field oxide layer 24 is formed by partially etching the first preliminary field oxide layer 22, i.e., removing those portions of the first preliminary field oxide layer 22 on the active regions of the substrate 10. The first preliminary field oxide layer 22 may be partially removed by a wet etching process.

It may be advantageous for the first field oxide layer 24, which is formed by the wet etching process, to fill up more than about 30% of a lower portion of the trench 16, and it may be even more advantageous for the first field oxide layer 24 to fill up at least 50% of the lower portion of the trench 16. If the first field oxide layer 24 fills up less than 30% of the lower portion of the trench 16, a subsequent process may be needed to form an adequate insulation layer filling the void in the trench 16. The first insulation liner 20 is still exposed along portions of the inner wall of the trench 16 that is not filled (i.e., not covered by) the first field oxide layer 24.

When the first field oxide layer 24 includes HDP oxide, it may develop voids within the layer, which can result from the characteristics of the high density plasma CVD process. In particular, where the trench 16 has a narrow and deep shape, a single step of a vapor-deposition process may not easily fill the inner space of the trench 16 completely and without generating voids.

Figure 5:
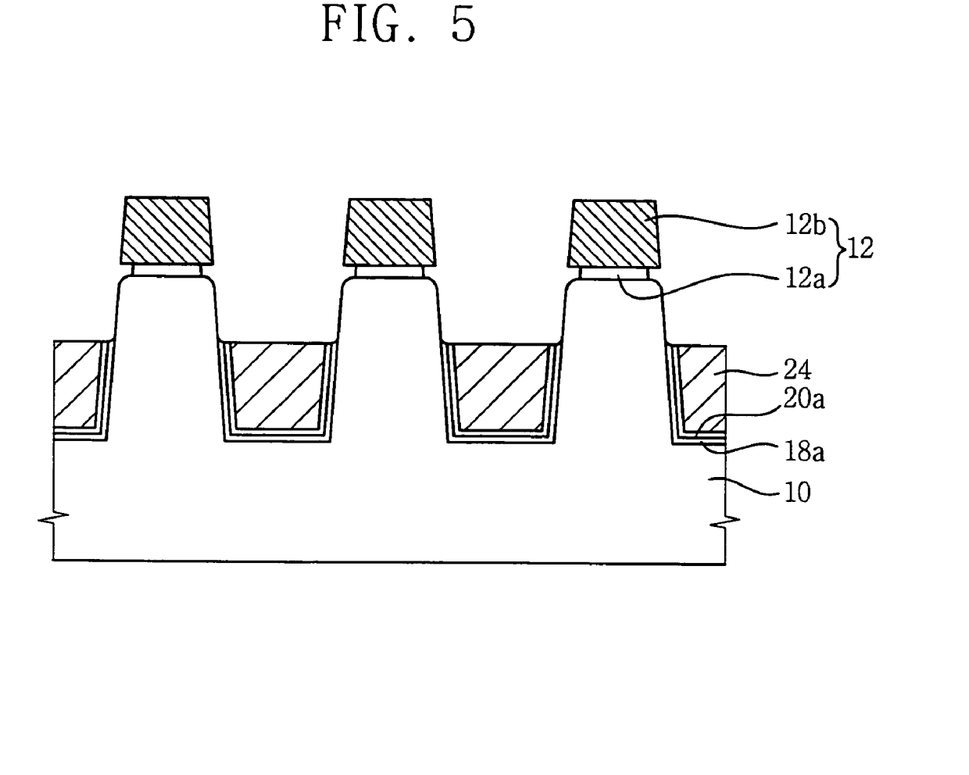

The first insulation liner 20 exposed on the inner wall of the trench 16 and the inner oxide layer 18 formed under the first insulation liner 20 can be completely removed to form a lower liner 20a and an inner oxide layer pattern 18a as shown in FIG. 5. The first insulation liner 20 and the inner oxide layer 18 may be removed by a wet etching process, specifically, using an HF solution or an LAL solution as an etchant thereof. Due to the above wet etching process, the inner wall of the trench 16 is exposed at those portions thereof that the first field oxide layer 24 is not filled.

Figure 6:
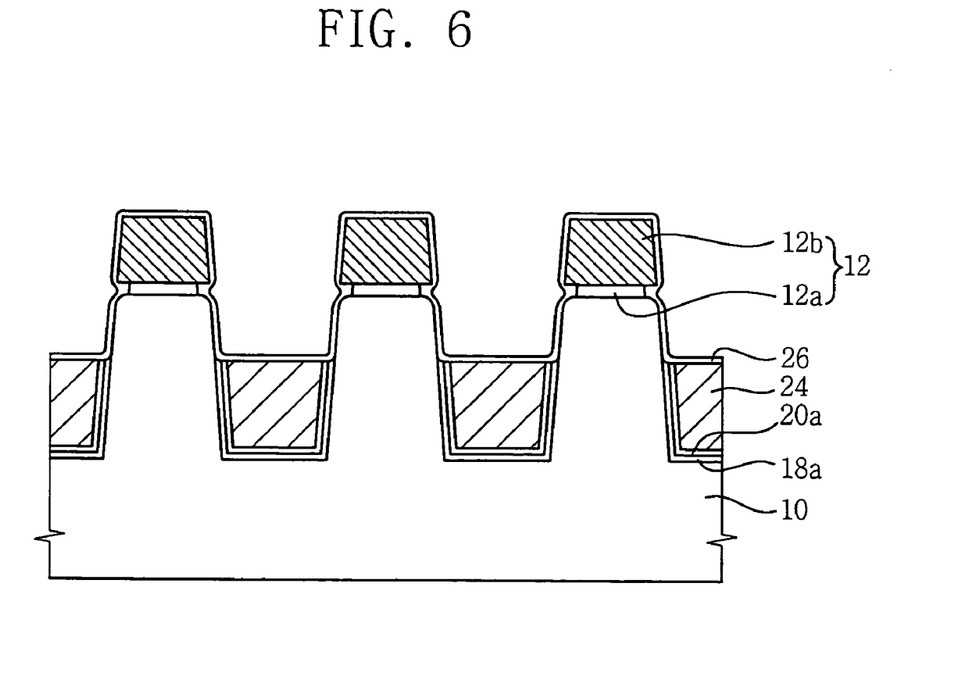

As illustrated in FIG. 6, an upper liner 26 is formed on the substrate 10 exposed along the inner wall of the trench 16 and on the first field oxide layer 24 in the trench 16. When the insulation layer completely filling up the trench 16 is formed in a subsequent process, the upper liner 26 can serve to reduce/avoid damage on portions on the substrate 10 that correspond to the inner wall of the trench 16. The upper liner 26 may be formed from a material having the same etching rate as or a higher etching rate than that of the insulation layer in the inner space of the trench 16 in the subsequent process, when etched under defined etching conditions. The upper liner 26 may be formed from, for example, undoped silicate glass (USG), and can include tetra ethyl ortho silicate (TEOS), TEOS-$O_3$, TEOS-$O_2$, and the like.

Figure 7:
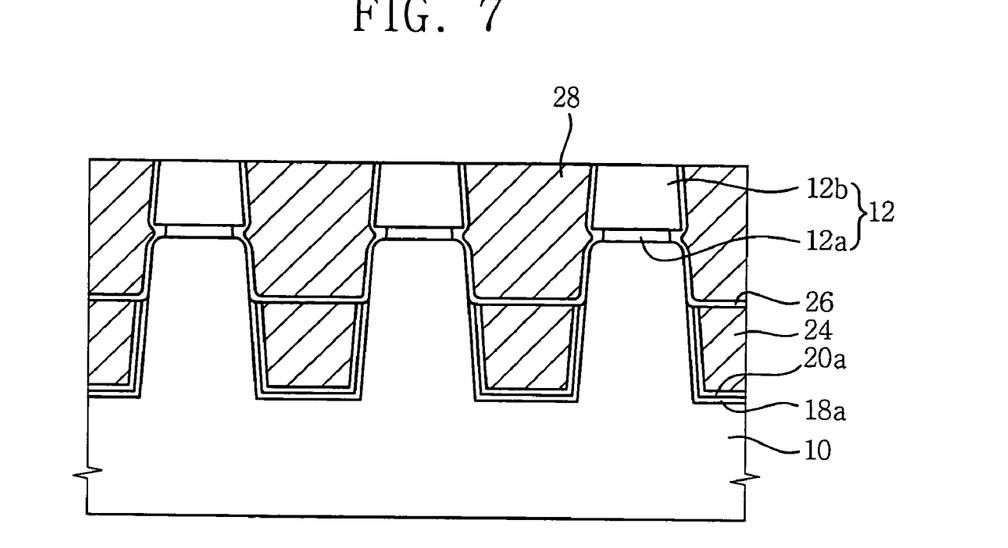

Referring to FIG. 7, a second preliminary field oxide layer (not shown) is formed in such a manner that the second preliminary field oxide layer completely fills the inside of the trench 16, and is formed on upper liner 26 and completely covers the hard mask pattern 12. For example, the second preliminary field oxide layer includes HDP oxide. Then, the second preliminary field oxide layer is planarized using a chemical mechanical polishing (CMP) process until the hard mask pattern 12 is exposed, thereby forming a second field oxide layer 28.

Figure 8:
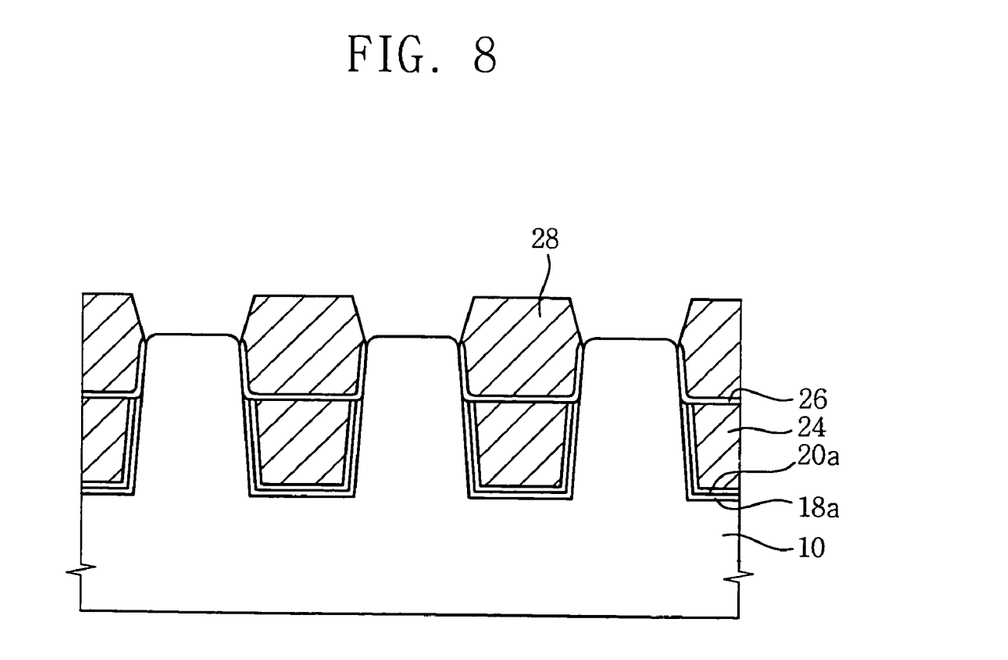

As shown in FIG. 8, a wet etching process is carried out to remove the exposed hard mask pattern 12. When the hard mask pattern 12 is removed, the active region of the substrate 10 beneath the hard mask pattern 12 is exposed. Accordingly, the second field oxide layer 28 extends away from the exposed active region of the substrate 10. A top surface of the second field oxide layer 28 is thereby higher than the surface of the exposed active region of the substrate 10.

Hereinafter, the change in the shape of the neighboring patterns, resulting from the above wet etching process, will be described. First, when an upper portion of the hard mask pattern 12, i.e., the silicon nitride layer pattern 12b is selectively etched, the lateral portion of the second field oxide layer 28 is continuously exposed as the silicon nitride layer pattern 12b is etched. In addition, the exposed lateral (i.e., sidewall) portion of the second field oxide layer 28 is also etched by a particular thickness due to a difference of the etching rates between the silicon nitride layer pattern 12b and the second field oxide layer 28. During the etching of the silicon nitride layer pattern 12b, an upper sidewall of the second field oxide layer 28 is exposed to the etchant for a longer period of time as compared with a lower sidewall thereof. Accordingly, an upper portion of the second oxide layer 28 is etched more than a lower portion thereof. When the buffer oxide layer pattern 12a beneath the silicon nitride layer pattern 12b is etched, the exposed sidewall of the second field oxide layer 28 is partially etched. As shown in FIG. 8, a portion of the second field oxide layer 28 that is higher than that of the active region has a slanted sidewall such that the upper portion of the second field oxide layer 28 is wider than the lower portion thereof.

Figure 9:
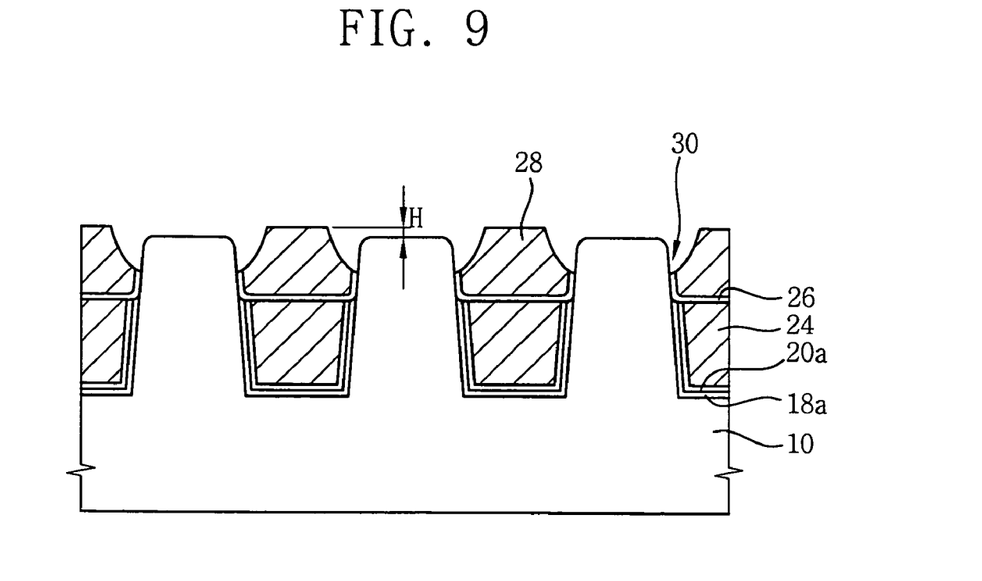

Referring to FIG. 9, the exposed second field oxide layer 28 and the upper liner 26 are partially removed through a wet etching process such that a dent 30 is formed in the exposed second field oxide layer 28 at the interface between the active region of the substrate 10 and the field region. The dent 30 exposes an upper portion of the sidewall of the active region of the substrate 10. The second field oxide layer 28 and the upper liner 26 may be partially etched using, for example, an HF solution or an LAL solution as an etchant. When the wet etching process is performed, the second field oxide layer 28 and the upper liner 26 in the proximity of the active region are partially removed to thereby expose the upper portion of the sidewall of the active region of the semiconductor substrate 10. The etchant can be provided downwardly and laterally to portions of the second field oxide layer 28 and the upper liner 26 adjacent to the active region, but the etchant may be provided downwardly only onto the surface of the second field oxide layer 28. Accordingly, the portions of the second field oxide layer 28 and the upper liner 26 adjacent to the active region are etched faster than a more central portion of the upper surface of the second oxide layer 28. In addition, since the upper liner 26 has a higher etching rate relative to the second field oxide layer 28, the portion of the second field oxide layer 28 adjacent to the active region can be etched much faster. Therefore, the exposed portion of the sidewall of the active region of the substrate 10 may be increased compared with conventional techniques, while a reduction in the height of the surface of the second field oxide layer 28 may be controlled.

After the wet etching process is carried out, the remaining second field oxide layer 28 has a surface higher than that of the active region of the substrate 10. For example, the difference H between the height of the upper surfaces of the second field oxide layer 28 and the active region can be less than about 150 Å. When the upper surface of the second field oxide layer 28 is lower than that of the active region, sufficient isolation between neighboring active regions of devices may not be obtained. When the difference H between the heights of the respective upper surfaces is larger than about 150 Å, etching second field oxide layer 28 may not develop a dent 30 therein that has an adequate depth to expose sidewalls of the active region.

Next, a wet cleaning process can be carried out using an SC1 cleaning solution to round off an upper edge portion of the active region. The SC1 cleaning solution can include a mixture of $NH_4OH$, $H_2O_2$ and $H_2O$.

Figure 10:
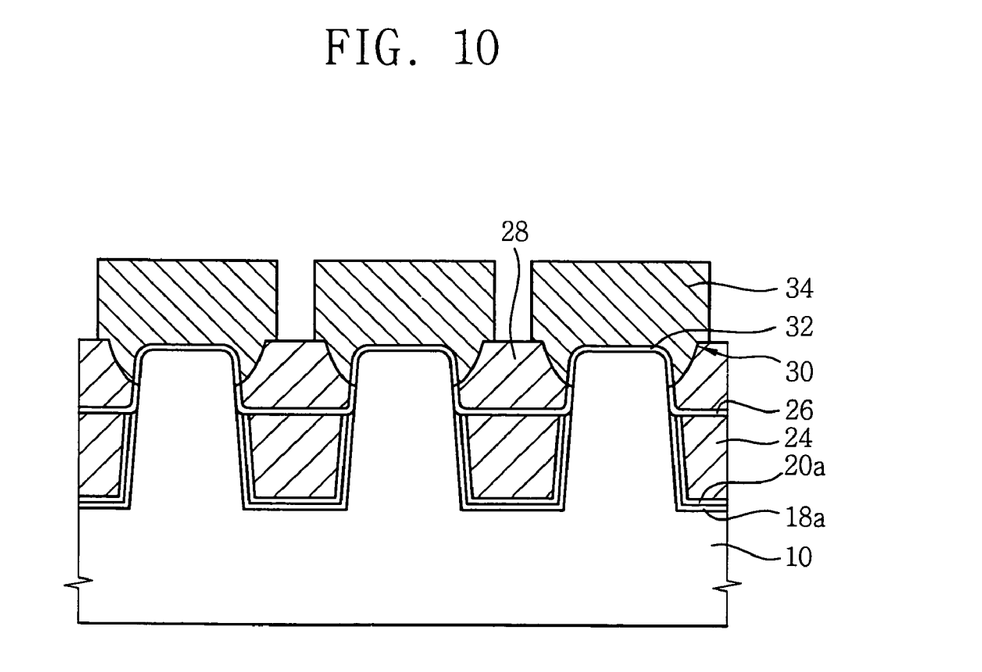

As illustrated in FIG. 10, after the upper surface and lateral face (sidewalls) of the exposed active region is thermally oxidized to form a tunnel oxide layer 32, a floating gate conductive layer (not shown) is formed on the tunnel oxide layer 32 and the second field oxide layer 28. Then, the floating gate conductive layer is patterned to form a floating gate electrode 34. The side edges of the floating gate electrode 34 are disposed on adjacent ones of the second field oxide layer 28, such as shown in FIG. 10.

Because the upper portion of the sidewall of the active region is exposed in the previous process, the tunnel oxide layer 32 has an increased contact area (interface) with the floating gate electrode 34 as compared with conventional techniques. The increased contact area can also be obtained without necessity of increasing the area occupied by a unit cell. Accordingly, the floating gate electrode 34 has an increased effective area so that the quantity of electric charges migrated through the tunnel oxide layer 32 by Fower-Nordheim (F-N) tunneling increases, which can provide an adequate cell current for desired cell characteristics.

Furthermore, because the edge portion of the active region is rounded off, the tunnel oxide layer 32 formed by the thermal oxidation process may not become substantially thicker at or near the edge portion of the active region. For example, the tunnel oxide layer 32 can be formed so that it has a substantially uniform thickness over the whole exposed area of the active region, or at least along its interface with the floating gate electrode 34, and which may improve distribution characteristics of the cell current.

Figure 11:
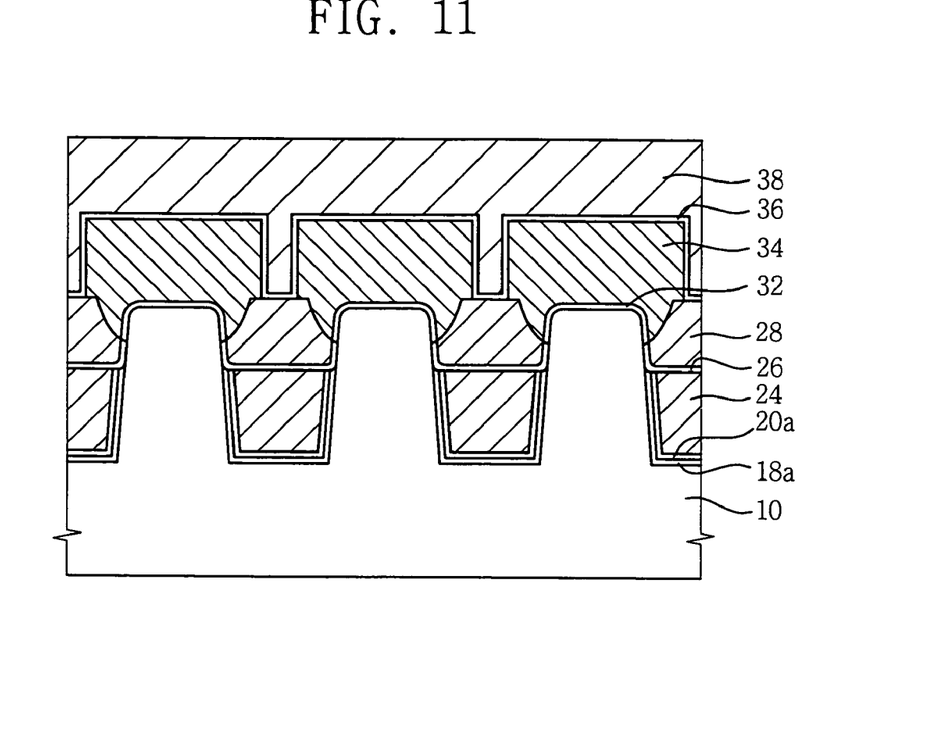

Referring to FIG. 11, a dielectric layer 36 is formed on the floating gate electrode 34. The dielectric layer 36 may have an oxide/nitride/oxide (ONO) structure. For example, the dielectric layer 36 includes a silicon oxide film, a silicon nitride film and a silicon oxide film sequentially formed on the floating gate electrode 34.

A conductive layer (not shown) for a control gate electrode 38 is formed on the dielectric layer 36. Then, the conductive layer is patterned to form the control gate electrode 38. The control gate electrode 38 is formed to have a line shape, which extends vertically in a direction in which the active region extends.

A non-volatile semiconductor memory device fabricated in accordance with at least some embodiments herein can have an increased effective interface area between the active region of the substrate 10 and the floating gate electrode 34, and, consequently, the quantity of electric charges capable of migrating through F-N tunneling may be increased and which can allow an adequate cell current for desired cell characteristics. Also, because the edge portion of the active region is rounded off, the tunnel oxide layer may be formed with a uniform thickness, which may improve the distribution characteristic of cell current.

FIGS. 12 to 16 are cross-sectional views that illustrate structure and methods of manufacturing a non-volatile semiconductor memory device according to some other embodiments of the present invention. Except for a process for forming a second field oxide layer, the methods of the present embodiment are substantially the same as those described with reference to FIGS. 1 to 10.

Figure 12:
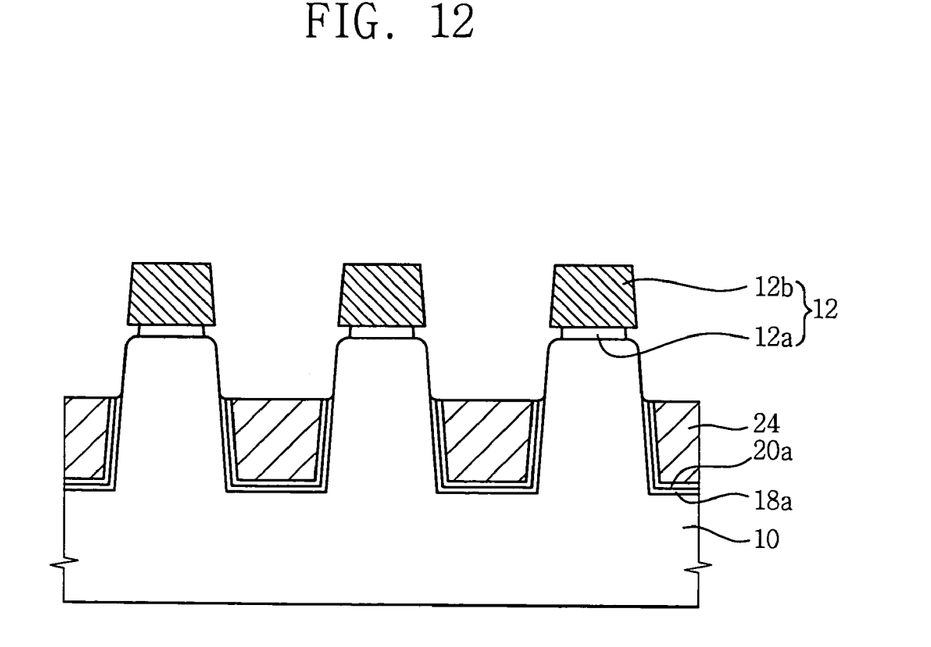
FIGS. 12 to 16 are cross-sectional views that illustrate structure and methods of manufacturing a non-volatile semiconductor memory device according to some other embodiments of the present invention.

As shown in FIG. 12, a hard mask pattern 12 having a bottom face larger than an upper face thereof is formed on a semiconductor substrate 10 including a semiconductor material such as silicon. A portion of the substrate 10 that is exposed by the hard mask pattern 12 is thermally oxidized to form a silicon oxide layer (not shown) so that the portion of the substrate 10 is rounded off at or near an upper edge portion of the hard mask pattern 12.

The silicon oxide layer and the substrate 10 are partially etched using the hard mask pattern 12 as an etching mask to form a trench that defines active regions and field regions. The silicon oxide layer formed by a thermal oxidation process is removed by a wet etching process. In particular, the silicon oxide layer may be removed by a wet etching process using an HF or an LAL solution as an etchant.

An inner wall of the trench is thermally oxidized to form an inner oxide layer thereon. Then, a first insulation liner is formed on the inner oxide layer by a CVD process. For example, the first insulation liner is formed by depositing an oxide such as MTO. Thereafter, a first preliminary field oxide layer is formed in such a way to completely or partially fill an inner space of the trench. The first preliminary field oxide layer may be formed using HDP oxide.

A first field oxide layer 24 is formed by partially etching the first preliminary field oxide layer, i.e., removing those portions of the first preliminary field oxide layer positioned in the active regions of the substrate 10. The first field oxide layer 24 partially fills up the inner space of the trench.

The first insulation liner exposed in the inner wall of the trench and the inner oxide layer formed beneath the first insulation liner are completely removed to form a lower liner 20a and an inner oxide layer pattern 18a. Due to the above removing process, a portion of the substrate 10 corresponding to an upper portion of the inner wall of the trench is exposed.

Figure 13:
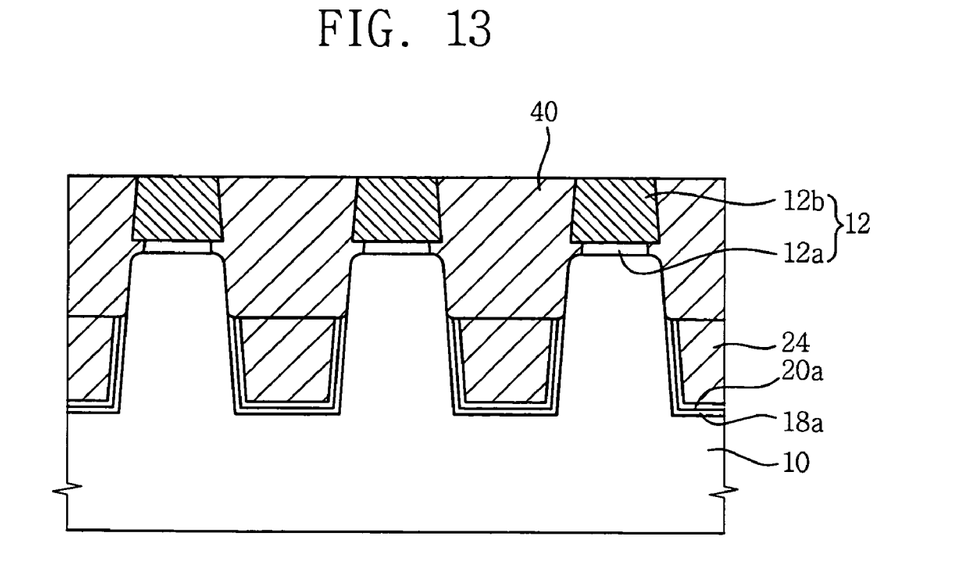

Referring to FIG. 13, a second preliminary field oxide layer (not shown) is formed on the exposed portion of the inner wall of the trench and on the first field oxide layer 24 filled in the trench. The second preliminary field oxide layer may be formed using a material that has, under predetermined etching conditions, an etching rate substantially identical or higher than that of the first field oxide layer 24. Particularly, the second preliminary field oxide layer may be formed by depositing a USG such as TEOS, TEOS-O$_3$, TEOS-O$_2$, and the like.

The second preliminary field oxide layer is planarized using a CMP process until the hard mask pattern 12 is exposed, thereby forming a second field oxide layer 40.

Figure 14:
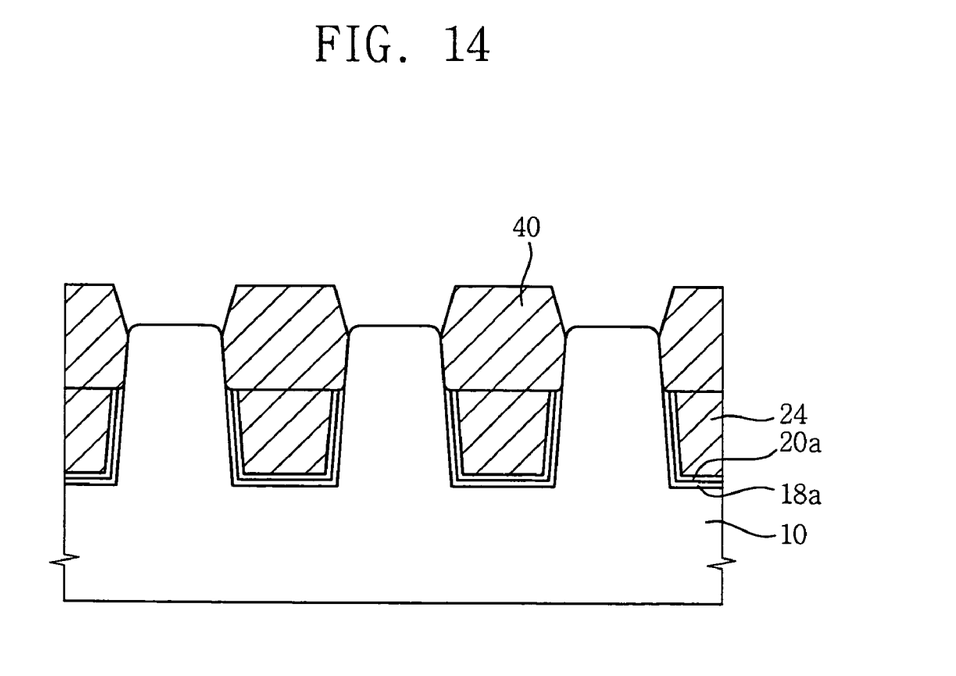

Referring to FIG. 14, the hard mask pattern 12 is removed through a wet etching process. In the wet etching process, an upper portion of the hard mask pattern 12, i.e., a silicon nitride layer pattern 12b is selectively etched. A lateral portion of the second field oxide layer 40 is continuously exposed while the silicon nitride layer pattern 12b is etched. In addition, the exposed lateral portion of the second field oxide layer 40 is etched by a predetermined thickness due to the difference of the etching rates between the silicon nitride layer pattern 12a and the second field oxide layer 40. During the etching of the silicon nitride layer pattern 12b, an upper portion of the second field oxide layer 40 is exposed to the etchant for a longer period of time relative to a lower portion of the second field oxide layer 40. As shown in FIG. 14, therefore, a portion of the second field oxide layer 40 that is higher than the active region has a slanted sidewall such that the upper portion of the second field oxide layer 40 is wider than the lower portion thereof.

Figure 15:
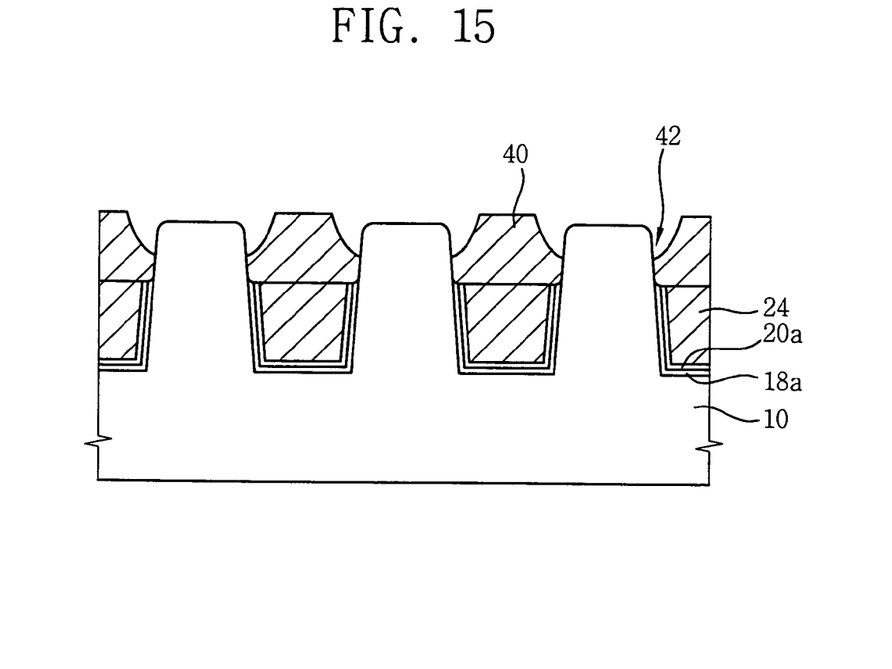

As illustrated in FIG. 15, the exposed second field oxide layer 40 is partially removed through a wet etching process to form a dent 42, thereby exposing in part the sidewall of the active region. After the wet etching process is carried out, a surface of the remaining second field oxide layer 40 is substantially higher that that of the active region. For example, after the wet etching process, the difference in the height of the surfaces between the second field oxide layer 40 and the active region can be less than about 150 Å. Particularly, the wet etching process is performed using an HF or an LAL solution as an etchant. When the wet etching process is carried out, the second field oxide layer 40 in the proximity of the active region is removed to thereby partially expose the sidewall of the active region, as depicted in FIG. 15.

When the second field oxide layer 40 is etched by the wet etching process using the HF or LAL solution as the etchant, the etchant is provided downwardly and laterally to portions of the second field oxide layer 40 adjacent to the active region, but the etchant may be provided downwardly only onto the surface of the second field oxide layer 40. Accordingly, the portions of the second field oxide layer 40 adjacent to the active region are etched faster than other portions of the second field oxide layer 40. Therefore, the exposed portion in the sidewall of the active region may be increased as compared with the conventional technique, while minimizing the reduction in the height of the surface of the second field oxide layer 40. Furthermore, because the second field oxide layer 40 is formed using a material having a higher etching rate relatively to that of the active region, the wet etching process may easily form an appropriate dent 42 to thereby expose the sidewall of the active region, even in case of a shorter period of etching time.

Next, a wet cleaning process is carried out using an SC1 cleaning solution to round off an upper edge portion of the active region.

Figure 16:
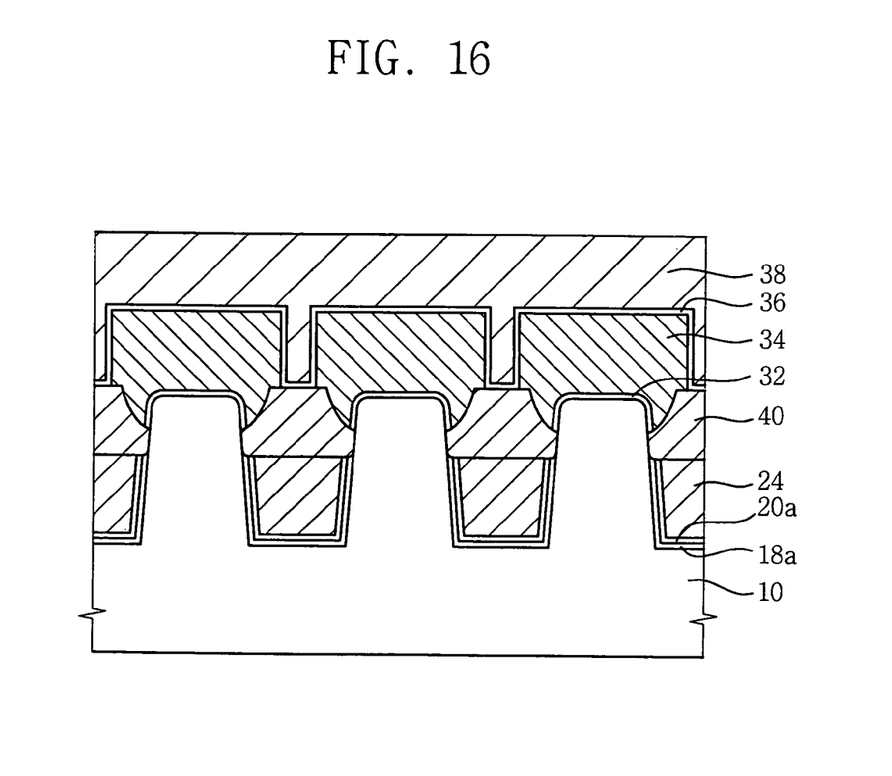

Referring to FIG. 16, the surface and lateral face of the exposed active region is thermally oxidized to form a tunnel oxide layer 32. Thereafter, a floating gate conductive layer (not shown) is formed on the tunnel oxide layer 32 and the second field oxide layer 40. Then, the floating gate conductive layer is patterned to form a floating gate electrode 34. The patterning process is carried out such that both edges of the floating gate electrode 34 are placed on the second field oxide layer 40, as depicted in FIG. 16.

Thereafter, a dielectric layer 36 is formed on the floating gate electrode 34. The dielectric layer 36 may have an ONO structure that includes a silicon oxide film, a silicon nitride film and a silicon oxide film. A conductive layer (not shown) for a control gate electrode 38 is formed on the dielectric layer 36. Then, the conductive layer is patterned to form the control gate electrode 38. The control gate electrode 38 is formed to have a line shape, which extends vertically to a running direction of the active region.

The above method of manufacturing the non-volatile semiconductor memory devices according to the some embodiments may eliminate an upper liner formation process for protecting the upper sidewall of the active region before forming the second field oxide layer. Therefore, it may provide an advantage of simplifying the process.

As described above, according to some embodiments of the present invention, an effective area of an active region may be increased and, thus, a quantity of electric charges capable of migrating through an F-N tunneling may also be increased, which may provide an adequate cell current to obtain desired characteristics of a non-volatile semiconductor memory device. Also, a tunnel oxide layer may be formed that has a uniform thickness, thereby improving a distribution characteristic of the cell current of the non-volatile semiconductor memory device.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. A method of manufacturing a semiconductor device, the method comprising:
    forming a trench in a semiconductor substrate;
    forming a first field oxide layer that partially fills the trench, the first field oxide layer defining an active region of the substrate adjacent thereto, wherein an upper portion of sidewalls of the trench extends upward beyond a surface of the first field oxide layer;
    forming a first liner on the first field oxide layer and the portion of the sidewalls of the trench that extends upward beyond the first field oxide layer;
    forming a second field oxide layer on the first liner and filling the trench;
    partially removing the second field oxide layer and the first liner to expose a top adjacent surface and upper sidewalls of the trench along the active region of the substrate;
    forming a dielectric layer on the exposed top adjacent surface and upper sidewalls of the trench; and
    forming a gate electrode on the dielectric layer.

2. The method of claim 1, wherein forming the first field oxide layer compnses:
    forming a hard mask pattern on the substrate and with a portion of the substrate exposed therebetween;
    etching the portion of the substrate that is exposed by the hard mask pattern to form the trench;
    forming the first field oxide layer to fill up the trench; and
    partially removing the first field oxide layer in the trench to expose an upper portion of the sidewalls of the trench.

3. The method of claim 2, after forming the trench, further comprising:
    forming an inner oxide layer by oxidizing the sidewalls and a bottom surface of the trench in the semiconductor substrate; and
    forming a second liner on the inner oxide layer in the trench, wherein the first field oxide layer is formed on the second liner opposite to the inner oxide layer.

4. The method of claim 3, prior to forming the first liner, further comprising removing a portion of the inner oxide layer and the second liner to expose the upper portion of the sidewalls of the trench.

5. The method of claim 2, after forming the hard mask pattern, further comprising thermally oxidizing the exposed portion of the substrate to form an oxide layer on the exposed portion of the substrate.

6. The method of claim 5, prior to forming the inner oxide layer, further comprising completely removing the oxide layer on the exposed portion of the substrate.

7. The method of claim 1, wherein the first liner comprises silicon oxide liner.

8. The method of claim 7, wherein the first liner comprises an undoped silicate glass (USG) liner.

9. The method of claim 1, wherein the first liner comprises a material having an etching rate that is at least as high as that of the second field oxide layer.

10. The method of claim 9, wherein the second field oxide layer comprises high density plasma (HDP) oxide, and the first liner comprises USG.

11. The method of claim 9, wherein the second field oxide layer and the first liner comprise USG.

12. The method of claim 1, wherein partially removing the second field oxide layer and the first liner is carried out by a wet etching process.

13. The method of claim 12, wherein partially removing the second field oxide layer and the first liner comprises forming a recessed dent in the second field oxide layer so that sidewalls of the second field oxide layer slope downward from an upper surface of the second field oxide layer to the sidewalls of the trench.

14. The method of claim 13, further comprising:
    forming the dielectric layer in the recessed dent of the second field oxide layer; and
    forming the gate electrode on the dielectric layer in the recessed dent of the second field oxide layer.

15. The method of claim 1, wherein partially removing the second field oxide layer and the first liner provides an upper surface of the second field oxide layer that is higher than an upper surface of the active region of the semiconductor substrate.

16. The method of claim 1, wherein the first field oxide layer and the second field oxide layer comprise a substantially identical insulation material.

17. The method of claim 16, wherein the first field oxide layer and the second field oxide layer each comprise HDP oxide.

18. The method of claim 1, prior to forming the dielectric layer, further comprising rounding an upper edge portion of the active region of the semiconductor substrate along the trench.

19. The method of claim 18, wherein rounding the upper edge portion of the active region comprises removing the upper edge portion with a cleaning solution.

20. The method of claim 1, after forming the gate electrode, further comprising:

forming a second dielectric layer on the gate electrode; and forming a second gate electrode on the second dielectric layer.

* * * * *